United States Patent
Nagasaki

(10) Patent No.: US 8,237,450 B2
(45) Date of Patent: Aug. 7, 2012

(54) METHOD OF TESTING INSULATION PROPERTY OF WAFER-LEVEL CHIP SCALE PACKAGE AND TEG PATTERN USED IN THE METHOD

(75) Inventor: Kenji Nagasaki, Tokyo (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 441 days.

(21) Appl. No.: 12/511,375

(22) Filed: Jul. 29, 2009

(65) Prior Publication Data

US 2010/0045304 A1   Feb. 25, 2010

(30) Foreign Application Priority Data

Aug. 21, 2008   (JP) ................ 2008-213326

(51) Int. Cl.
*G01R 31/00*     (2006.01)
*H01H 31/12*     (2006.01)

(52) U.S. Cl. ....................... 324/551; 324/541

(58) Field of Classification Search ............ 324/757.03, 324/541, 544, 551, 557
See application file for complete search history.

(56) References Cited

U.S. PATENT DOCUMENTS

2002/0196101 A1* 12/2002 Tsujiguchi ............... 333/175
2005/0199979 A1*  9/2005 Shimoishizaka et al. ..... 257/528

FOREIGN PATENT DOCUMENTS

JP    2003-347410    12/2003

* cited by examiner

*Primary Examiner* — Vincent Q. Nguyen
(74) *Attorney, Agent, or Firm* — Kubotera & Associates, LLC

(57) ABSTRACT

A test element group (TEG) pattern formed of two wiring patterns alternately disposed in a swirl configuration is used for testing an insulation property of a wafer-level chip scale package (WL-CSP) having a micro wiring such as an inductor element. The insulation property of the WL-CSP can be monitored with enhanced accuracy by measuring a resistance value between solder terminals electrically connected to the swirl-shaped TEG pattern.

18 Claims, 6 Drawing Sheets

METHOD OF TESTING INSULATION PROPERTY OF WAFER-LEVEL CHIP SCALE PACKAGE AND TEG PATTERN USED IN THE METHOD

BACKGROUND OF THE INVENTION AND RELATED ART STATEMENT

The present invention relates to a method of testing an insulation property of a wafer-level chip scale package (WL-CSP), and a test element group (TEG) pattern used in the method.

In recent years, as electronic devices become smaller and more functionally sophisticated, semiconductor devices (semiconductor packages) have been required to provide multiple terminals as a consequence of miniaturization and high densification of packages thereof. In response to such request, various kinds of chip scale packages (CSPs) have been developed as miniature packages having multiple terminals.

In particular, a WL-CSP technique has gathered attention recently as a technique capable of providing an ultimate miniature package with a size similar to that of a bare chip. When the WL-CSP is produced, an insulating resin film is formed on an entire surface of a semiconductor wafer on which a plurality of integrated circuits is provided. Then, wiring patterns are formed on the insulating resin film for electrically connecting pad electrodes of the integrated circuits and external terminals such as bumps via contact holes. In the final process step, the semiconductor wafer is divided into chip-size parts.

Moreover, a semiconductor package having inductor elements within a package thereof has been introduced. Unlike conventional inductor elements that are so-called "external components" separated from a semiconductor chip, the inductor elements are formed on an insulating resin film of a WL-CSP-type semiconductor device by the use of an interconnect material relative to external terminals. The WL-CSP-type semiconductor device having the inductor elements is also expected to be an ultra-compact semiconductor package which can be applied to a frequency of hundreds of megahertz (MHz) to several giga-hertz (GHz) such as portable devices and wireless LAN devices.

Hereinafter, a conventional WL-CSP-type semiconductor device having an inductor element on an insulating resin film covering integrated circuits is briefly described.

On a main surface of a semiconductor chip where integrated circuits are provided, an insulating resin film is formed with a passivation film in between. In the insulating resin film, a plurality of contact holes is formed to expose pad electrodes of the integrated circuits. On the first insulating resin film, a plurality of lands having a substantially flat-circular shape is formed. Wiring patterns are formed on the insulating resin film, where each of the wiring patterns has one end connected to a corresponding contact hole and the other end connected to a corresponding land. Further, the inductor element having both terminals connected to respective pad electrodes through corresponding contact holes is formed on a region of the insulating resin film where a plurality of lands is relatively sparsely provided.

On the insulating resin film, another insulating resin is formed. The insulating resin covers the wiring patterns and the inductor element while having a plurality of openings that expose each of the lands. Over each of the openings, an external terminal is formed of a solder paste material through printing processes.

Patent Reference: Japanese Patent Publication No. 2003-347410

In the WL-CSP-type semiconductor chips, an insulation property thereof is usually tested or confirmed using a test element group (TEG) chip. FIG. 1 shows a conventional TEG chip having an insulation test pattern.

As shown in FIG. 1, two rewired lines 12 having different potentials are disposed in a comb teeth arrangement facing to each other. The rewired lines 12 having the different potentials are respectively connected to posts 18 formed over a rewiring layer 16. The rewired lines 12 are eventually connected to respective solder terminals, so that the electrical insulation property of the semiconductor chip is confirmed.

In the rewired lines 12 or the conventional insulation test pattern 12 with the comb teeth arrangement, it is difficult to accurately evaluate an insulation property of an inductor element having a rewired pattern with a spiral shape. Further, when the rewired pattern with the spiral shape is formed, as opposed to the rewired pattern with the comb teeth arrangement, it is difficult to stir an etching solution of an under bump metal (UBM) film. Consequently, it is difficult to precisely form the UBM film especially at a center region of the spiral shape, thereby degrading insulation properties. Even when the TEG chip having the insulation test pattern 12 with the comb teeth arrangement indicates good insulation quality of the chip, the chip may have an insufficient insulation in the region where the inductor element is formed.

In view of the problem described above, an object of the present invention is to provide a TEG chip capable of evaluating insulation properties with increased accuracy.

Further objects and advantages of the invention will be apparent from the following description of the invention.

SUMMARY OF THE INVENTION

In order to attain the objects described above, according to a first aspect of the present invention, in a method of testing an insulation property of a wafer level chip scale package (WL-CSP), a test element group (TEG) pattern is used, and the TEG pattern has a swirl shape. The swirl shape refers to as a configuration or an arrangement substantially similar to a spiral pattern of an inductor element. Preferably, the TEG pattern has a line-to-space ratio (L/S) similar to that of the inductor element.

According to a second aspect of the present invention, a TEG pattern is used in an insulation test on a WL-CSP having an inductor element, and the TEG pattern has a swirl shape.

In the present invention, the TEG pattern has the swirl shape. Accordingly, it is possible to accurately evaluate the insulation property of the WL-CSP having the inductor element. In other word, when the TEG pattern has the swirl shape substantially similar to the of the inductor element, it is possible to perform the insulation test under a same condition or a substantially similar condition, thereby obtaining an accurate result reflecting an actual condition.

DETAILED DESCRIPTION OF PREFERRED EMBODIMENTS

Figure 1:
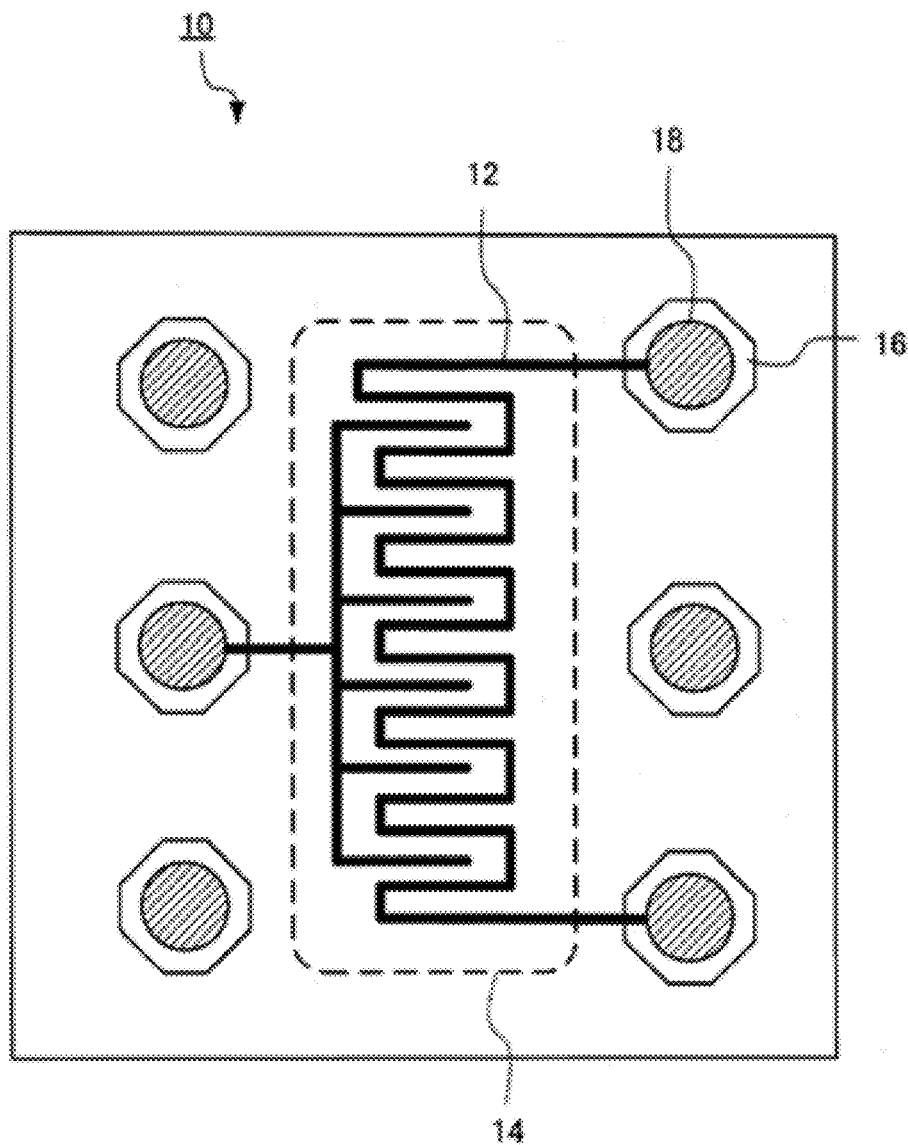
FIG. 1 is a plan view showing a structure of a conventional test element group (TEG) chip.

Hereunder, embodiments of the present invention will be explained with reference to the accompanying drawings. The drawings schematically show shapes, sizes, and positional relationships of constituents, and the invention is not limited to those shown in the drawings. In the drawings, a size, a shape, and an arrangement of constituting components are schematically shown for explanation of the present invention. Specific materials, conditions, and numerical conditions described in the following description are just examples. In the following description, same reference numerals denote similar components, and explanations thereof may be omitted.

First Embodiment

Figure 2:
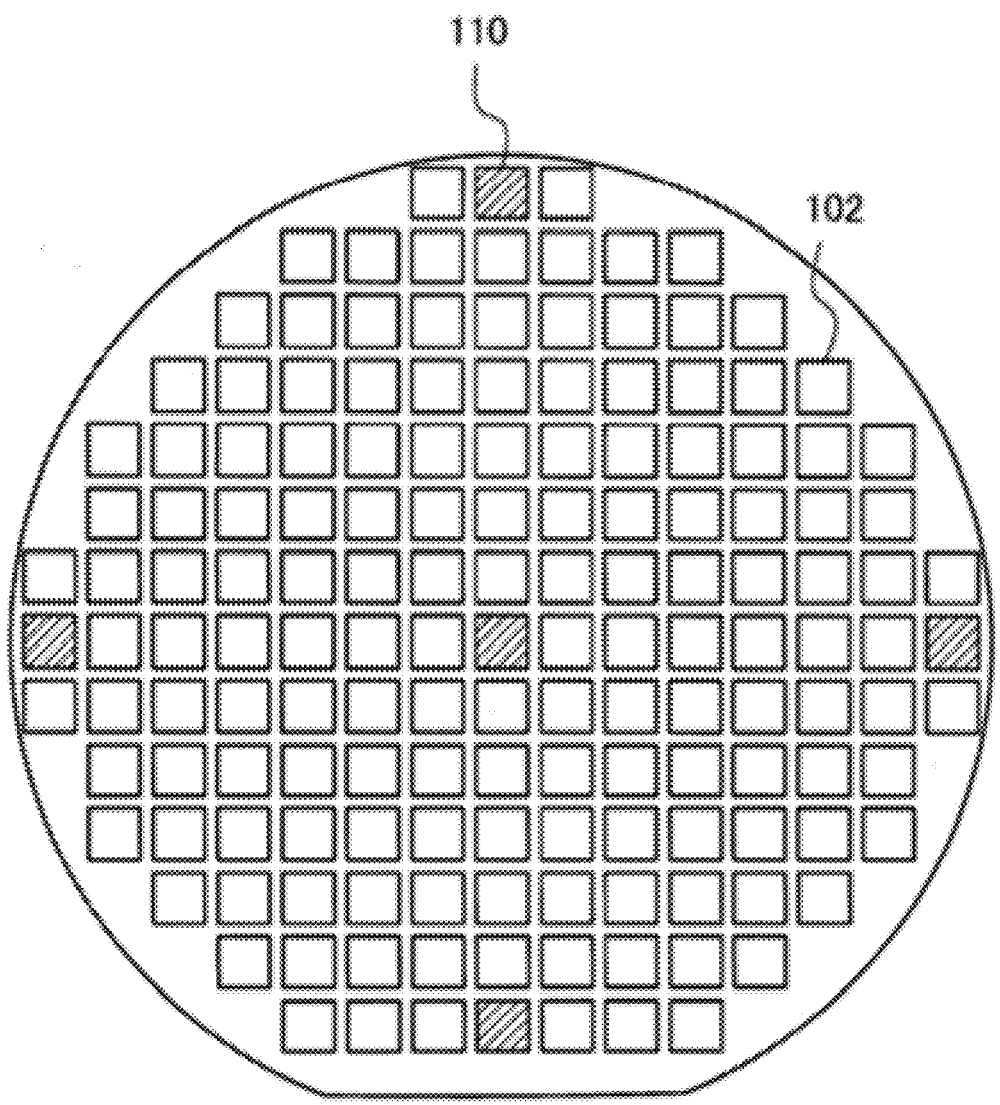
FIG. 2 is a plan view showing a wafer with TEG chips arranged thereon according to a first embodiment of the present invention.

A first embodiment of the present invention will be explained. FIG. 2 is a plan view of a wafer showing a layout of TEG chips 110 according to the first embodiment of the present invention.

As shown in FIG. 2, the TEG chips 110 are disposed at five positions on the wafer. A large number of other chips 102 eventually to be formed in wafer level chip scale packages (WL-CSPs) are disposed on the wafer as well. The number of the TEG chips 110 and the layout thereof are not limited to that in FIG. 2, and other modifications can be adopted.

Figure 3:
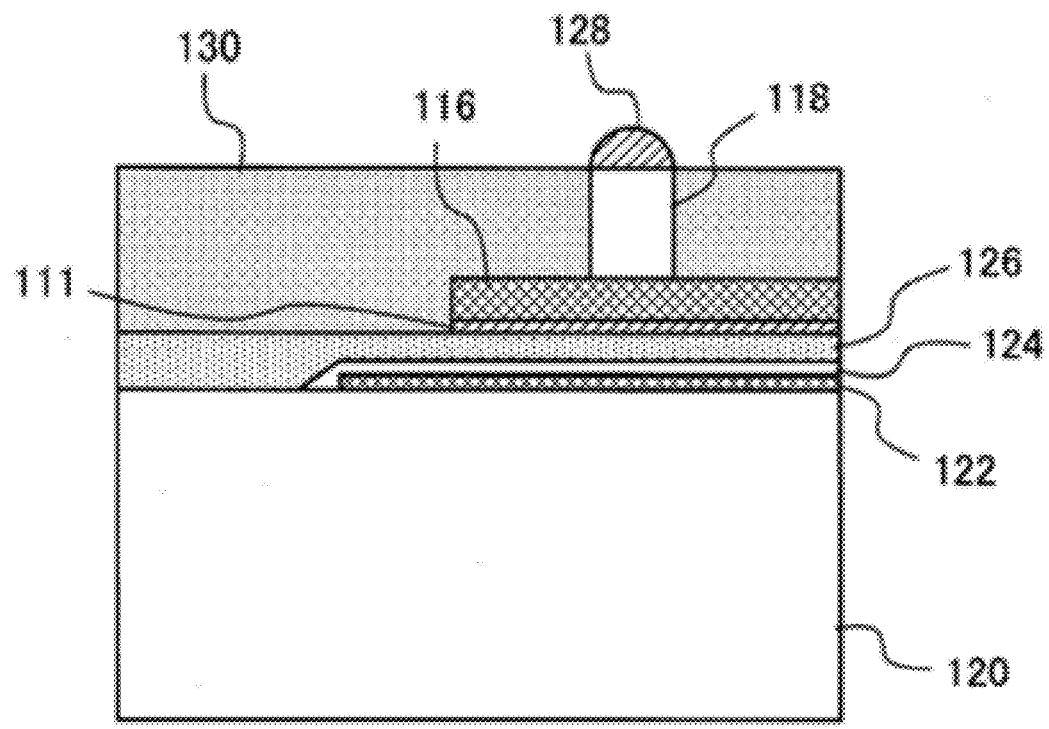
FIG. 3 is a sectional view showing a wafer level chip scale package (WL-CSP) according to the first embodiment of the present invention.

FIG. 3 is a sectional view showing a structure of the WL-CSPs according to the first embodiment of the present invention.

As shown in FIG. 3, a wiring layer 122 (formed of a material such as Al, Cu, and the likes) is formed on a surface of a silicon substrate 120. A passivation (PV) film 124 is formed on the wiring layer 122 as an insulating layer for protecting the wiring layer 122. The structure described above may be produced with a manufacturing method similar to that of a conventional semiconductor device.

In the next step, while the structure described above is maintained in the wafer, an insulating film 126 such as a polyimide film is formed on the PV film 124. Further, an under bump metal (UBM) film 111 (formed of Ti/Cu) is formed on the insulating film 126. Still further, a rewiring layer 116 (formed of a material such as Cu and the likes) is formed on the UBM film 111.

In the next step, a post 118 is formed on the rewiring layer 116, and a sealing material 130 seals a surrounding region of the post 118. Subsequently, a solder terminal 128 is formed on the post 118. Finally, the wafer is divided into each of the complete chips through a dicing process.

Figure 4:
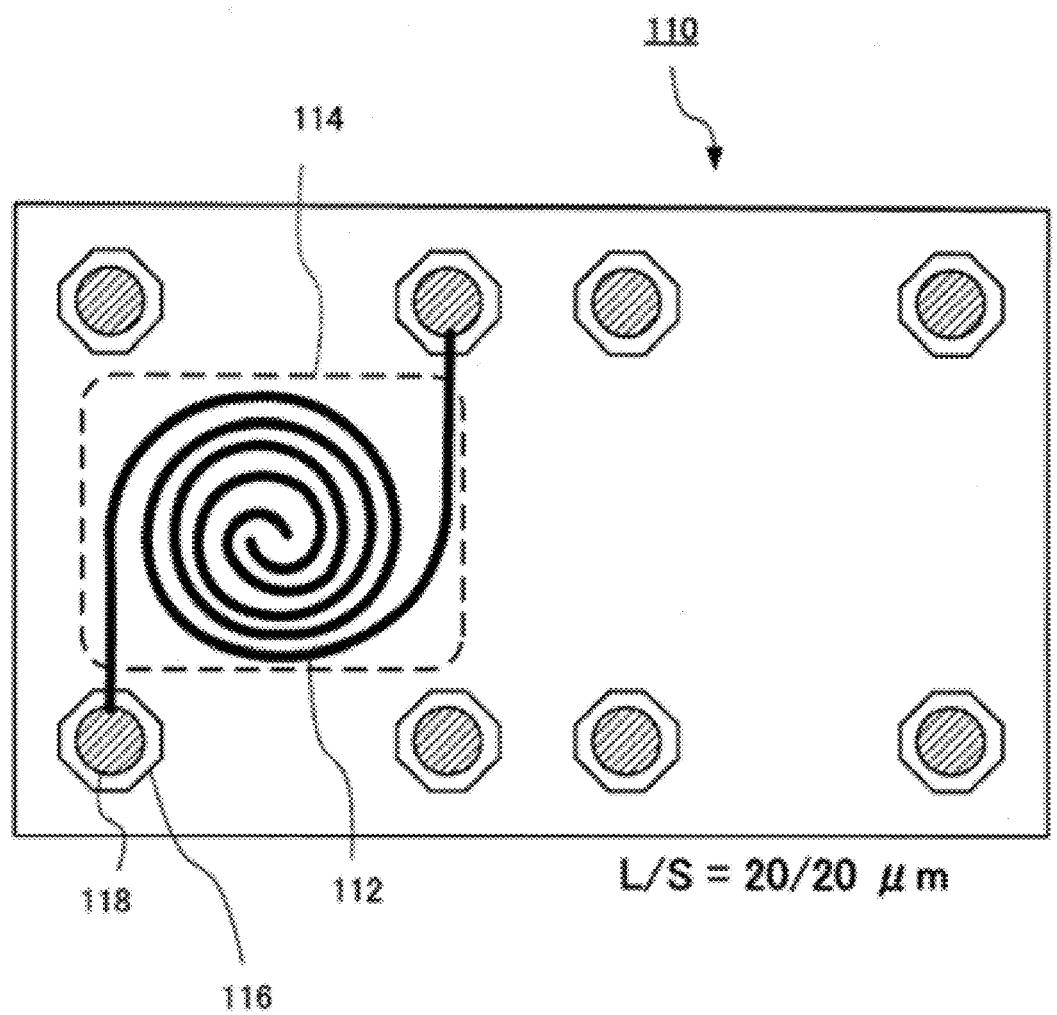
FIG. 4 is a plan view showing the TEG chip according to the first embodiment of the present invention.

FIG. 4 is a plan view showing a structure of the TEG chip 110 according to the first embodiment of the present invention. The TEG chip 110 shown in FIG. 4 has a structure similar to that shown in FIG. 3.

As shown in FIG. 4, an insulation test pattern 112 formed in a swirl configuration or a swirl shape is disposed as a part of the rewiring layer 116 of the TEG chip 110. The insulation test pattern 112 is formed of two wiring patterns with different potentials disposed, and the wiring patterns are formed in a swirl configuration and arranged to face each other while maintaining a predetermined space between the wiring patterns.

In the embodiment, the insulation test pattern 112 or the wiring patterns are connected to the posts 118, respectively.

Further, the insulation test pattern 112 is connected to solder terminals 128 (refer to FIG. 3). An end portion of one of the wiring patterns (an end portion which is not connected to the post 118) is disposed closely to an end portion of the other of the wiring patterns (an end portion which is not connected to another post 118). Further, in the insulation test pattern 112, one of the wiring patterns and the other of the wiring patterns are alternately disposed and extend outwardly from a center region of the insulation test pattern 112. The insulation test pattern 112 has a line-to-space ratio (L/S) of 20 μm/20 μm.

Next, a manufacturing process of the TEG chip 110 according to the first embodiment of the present invention is explained. When the WL-CSP is manufactured, the UBM film 111 is etched with a wet etching method. When the etching is insufficient, the rewiring layer 116 may become a short circuit caused by an insulation failure. The insulation test pattern 112 with the swirl shape is used for monitoring the short circuit. When the UBM film 111 is not sufficiently etched, the insulation test pattern 112 disposed in the swirl configuration may create a short circuit. After the TEG chip 110 is manufactured, a resistance value between the solder terminals 128 connected to the insulation test pattern 112 is measured, thereby making it possible to evaluate an insulation property of the chip.

As described above, in the first embodiment of the present invention, the insulation test pattern 112 is formed of a pair of the wiring patterns with the different potentials, and the wiring patterns are disposed in the swirl configuration to face each other. Therefore, it is possible to confirm the insulation property of the WL-CSP having a micro wiring such as an inductor wiring pattern with enhanced accuracy in the state that the WL-CSPs are formed on the same wafer.

Second Embodiment

Figure 5:
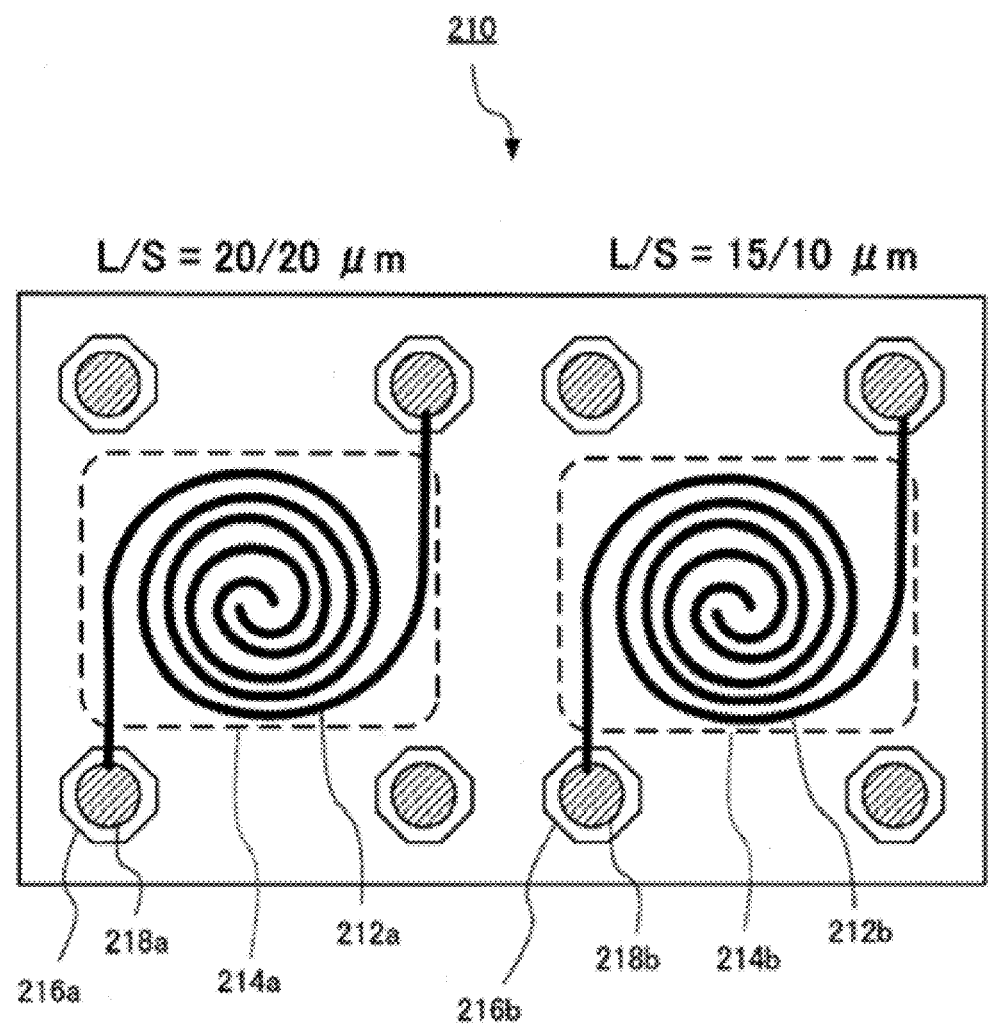
FIG. 5 is a plan view showing a TEG chip according to a second embodiment of the present invention.

A second embodiment of the present invention will be explained next. FIG. 5 is a plan view showing a structure of a TEG chip 210 according to the second embodiment of the present invention. The TEG chip 210 shown in FIG. 5 has a structure similar to that shown in FIG. 3.

As shown in FIG. 5, the TEG chip 210 includes insulation test patterns 212a and 212b with a swirl shape, and the insulation test patterns 212a and 212b are connected to rewiring layers 216a and 216b. Each of the insulation test patterns 212a and 212b is formed of two wiring patterns with different potentials disposed, and the wiring patterns are formed in a swirl configuration and arranged to face each other while maintaining a predetermined space between the wiring patterns.

In the embodiment, the insulation test patterns 212a and 212b are connected to posts 218a and 218b, respectively. Further, the insulation test patterns 212a and 212b are connected to solder terminals 128 (refer to FIG. 3). In the insulation test pattern 212a, end portion of one of the wiring patterns (an end portion which is not connected to the post 218a) is disposed closely to an end portion of the other of the wiring patterns (an end portion which is not connected to another post 218a). Further, in the insulation test pattern 212a, one of the wiring patterns and the other of the wiring patterns are alternately disposed and extend outwardly from a center region of the insulation test pattern 212a.

In the embodiment, the insulation test pattern 212b is formed in a manner similar to that of the insulation test pattern 212a. The insulation test pattern 212a has a line-to-space ratio (L/S) of 20 μm/20 μm. The insulation test pattern 212b has a line-to-space ratio (L/S) of 15 μm/10 μm. In other words, the insulation test patterns 212a and 212b having the different line-to-space ratios (L/S) are formed on the single TEG chip 210.

In the embodiment, a manufacturing process of the TEG chip 210 is similar to that of the TEG chip 110 in the first embodiment explained above, and an explanation thereof is omitted.

As described above, according to the second embodiment of the present invention, each of the insulation test patterns 212a and 212b is formed of a pair of the wiring patterns with the different potentials, and the wiring patterns are disposed in the swirl configuration in which the wiring patterns are arranged to face each other in the manner similar to the first embodiment. Therefore, it is possible to confirm the insulation property of the WL-CSP having a micro wiring such as an inductor wiring pattern with enhanced accuracy in the state that the WL-CSPs are formed on the same wafer.

Furthermore, with the insulation test patterns 212a and 212b having the different line-to-space ratios (L/S), it is possible to monitor the insulation properties of the WL-CSPs more accurately.

Third Embodiment

Figure 6A:
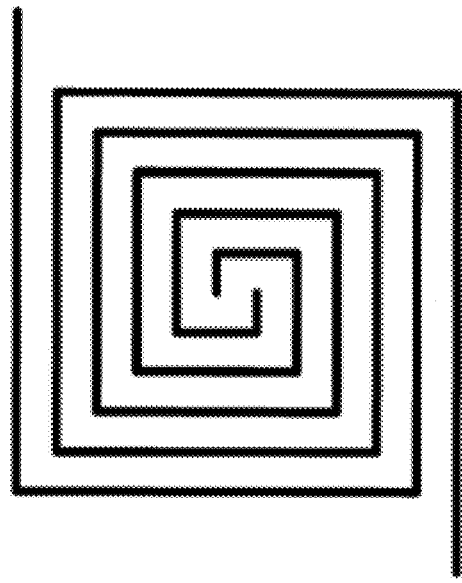
FIGS. 6(A) and 6(B) are plan views showing a TEG pattern according to a third embodiment of the present invention.
Figure 6B:
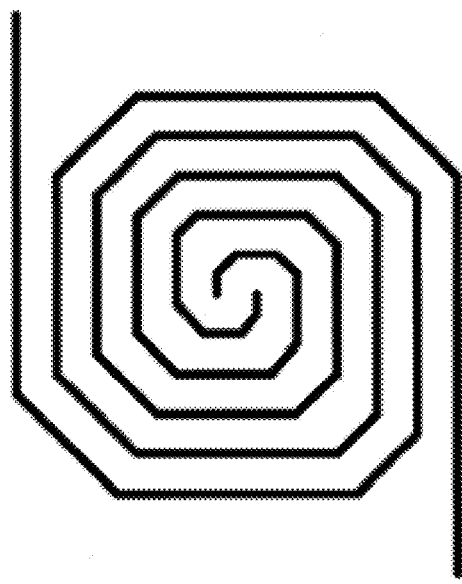

A third embodiment of the present invention will be explained next. FIGS. 6(A) and 6(B) are plan views showing TEG patterns according to the third embodiments of the present invention.

In the third embodiment, other than the circular swirl configuration described in the first and the second embodiments, the TEG patterns may have a rectangular-spiral configuration 314 or a polygonal-spiral configuration 414 as shown in FIGS. 6(A) and (B), respectively.

While the invention has been explained with reference to the specific embodiments of the invention, the present invention is not limited to these embodiments and the scope of the invention will be limited only by the appended claims.

The present invention is applicable not only to the WL-CSPs, but also to other real chip size CSPs. Other than forming the swirl-shaped TEG pattern on the TEG chip, the swirl-shaped TEG pattern may be formed on a regular WL-CSP which is not used for a test.

The disclosure of Japanese Patent Application No. 2008-213326, filed on Aug. 21, 2008, is incorporated in the application.

While the invention has been explained with reference to the specific embodiments of the invention, the explanation is illustrative and the invention is limited only by the appended claims.

What is claimed is:

1. A method of testing an insulation property of a wafer level chip scale package (WL-CSP), comprising the steps of:
    placing a test element group (TEG) pattern on the WL-CSP; and
    testing the insulation property of the WL-CSP,
    wherein said TEG pattern has a swirl shape,
    said TEG pattern includes a first wiring pattern and a second wiring pattern,
    said first wiring pattern has a first free-end portion substantially at a center of the swirl shape, and
    said second wiring pattern has a second free-end portion substantially at the center of the swirl shape and away from the first free-end portion.

2. The method according to claim 1, wherein said WL-CSP includes an inductor element.

3. The method according to claim 1, wherein said TEG pattern is formed on a TEG chip.

4. The method according to claim 1, wherein said TEG pattern includes a plurality of patterns having different line-to-space ratios (L/S) formed on a single TEG chip.

5. The method according to claim 1, wherein said TEG pattern is formed on a regular WL-CSP type semiconductor chip.

6. A test element group (TEG) pattern used in an insulation test of a wafer-level chip scale package (WL-CSP) having an inductor element,
    wherein said TEG pattern has a swirl shape,
    said TEG pattern includes a first wiring pattern and a second wiring pattern,
    said first wiring pattern has a first free-end portion substantially at a center of the swirl shape, and
    said second wiring pattern has a second free-end portion substantially at the center of the swirl shape and away from the first end portion.

7. The TEG pattern according to claim 6, wherein said TEG pattern is formed on a TEG chip.

8. The TEG pattern according to claim 7, wherein said TEG pattern includes a plurality of patterns having different line-to-space ratios (L/S) formed on a single TEG chip.

9. The TEG pattern according to claim 6, wherein said TEG pattern is formed on a regular WL-CSP-type chip.

10. A method of testing an insulation property of a wafer level chip scale package (WL-CSP) using a test element group (TEG) pattern, comprising the steps of:
    forming the TEG pattern having a swirl shape on a wafer, said TEG pattern having a first wiring pattern and a second wiring pattern alternately disposed in the swirl shape while maintaining a predetermined line-and-space (L/S) in between;
    connecting the first wiring pattern to a first terminal and the second wiring pattern to a second terminal;
    measuring a resistance value between the first terminal and the second terminal; and
    confirming the insulation property of the WL-CSP according to the resistance value.

11. A test element group (TEG) pattern used in an insulation test of a wafer-level chip scale package (WL-CSP) having an inductor element, comprising:
    a first wiring pattern having a first swirl shape; and
    a second wiring pattern disposed alternately relative to the first wiring pattern in a second swirl shape while maintaining a predetermined line-and-space (L/S) between the first wiring pattern and the second wiring pattern.

12. The TEG pattern according to claim 11, wherein said TEG pattern is formed on a TEG chip.

13. The TEG pattern according to claim 11, wherein said TEG pattern includes a plurality of patterns having different line-to-space ratios (L/S) formed on a single TEG chip.

14. The TEG pattern according to claim 11, wherein said TEG pattern is formed on a regular WL-CSP-type chip.

15. The method according to claim 10, wherein said WL-CSP includes an inductor element.

16. The method according to claim 10, wherein said TEG pattern is formed on a TEG chip.

17. The method according to claim 10, wherein said TEG pattern includes a plurality of patterns having different line-to-space ratios (L/S) formed on a single TEG chip.

18. The method according to claim 10, wherein said TEG pattern is formed on a regular WL-CSP type semiconductor chip.

* * * * *